United States Patent
Wang

(10) Patent No.: US 12,004,407 B2
(45) Date of Patent: Jun. 4, 2024

(54) DISPLAY PANEL INCLUDING ANTI-CRACK STRUCTURE WITHIN CHAMFERED RECESS, MANUFACTURING METHOD THEREOF AND DISPLAY DEVICE

(71) Applicants: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

(72) Inventor: Junyuan Wang, Hubei (CN)

(73) Assignees: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 570 days.

(21) Appl. No.: 17/297,361

(22) PCT Filed: Apr. 23, 2021

(86) PCT No.: PCT/CN2021/089302
§ 371 (c)(1),
(2) Date: May 26, 2021

(87) PCT Pub. No.: WO2022/217638
PCT Pub. Date: Oct. 20, 2022

(65) Prior Publication Data
US 2023/0180577 A1 Jun. 8, 2023

(30) Foreign Application Priority Data
Apr. 16, 2021 (CN) .......................... 202110410204.2

(51) Int. Cl.
H10K 59/65 (2023.01)
H10K 59/80 (2023.01)
H10K 71/00 (2023.01)

(52) U.S. Cl.
CPC .......... H10K 59/65 (2023.02); H10K 59/873 (2023.02); H10K 71/00 (2023.02)

(58) Field of Classification Search
CPC ... H01L 59/1201; H01L 59/65; H01L 59/873; H01L 71/00
(Continued)

(56) References Cited

U.S. PATENT DOCUMENTS 10,541,380 B1* 1/2020 Sung ................... H10K 59/124
2020/0006700 A1* 1/2020 Kim .................. H10K 50/8426
(Continued)

FOREIGN PATENT DOCUMENTS

| CN | 110660826 A | 1/2020 |
| CN | 110660828 A | 1/2020 |

(Continued)

OTHER PUBLICATIONS

International Search Report in International application No. PCT/CN2021/089302, dated Dec. 23, 2021.
(Continued)

*Primary Examiner* — Matthew E. Gordon

(57) ABSTRACT

A display panel, a manufacturing method thereof, and a display device are disclosed. For the display panel, an anti-crack structure is disposed in a chamfer between a driving circuit layer and a substrate. The anti-crack structure is in contact with a packaging layer to reduce an angle from
(Continued)

the contact plane of the anti-crack structure and the packaging layer to the plane in which a light-emitting layer is located, so that the packaging layer is smoothly disposed, the risk of the fracture of the packaging layer is lowered, and the failure of the display panel is avoided.

18 Claims, 7 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2020/0006701 A1* | 1/2020 | Lee | ................... | H10K 59/87 |
| 2020/0083475 A1* | 3/2020 | Kang | ................... | H10K 59/124 |
| 2020/0106045 A1* | 4/2020 | Han | ................... | H10K 59/65 |
| 2020/0403050 A1* | 12/2020 | Seon | ................... | H10K 71/00 |
| 2021/0066657 A1* | 3/2021 | Chen | ................... | H10K 71/00 |
| 2021/0408472 A1* | 12/2021 | Zhang | ................... | H10K 71/00 |
| 2023/0147236 A1* | 5/2023 | Sun | ................... | H10K 59/1201 257/40 |

FOREIGN PATENT DOCUMENTS

| | | | |
|---|---|---|---|
| CN | 110678997 | A | 1/2020 |
| CN | 111403621 | A | 7/2020 |
| CN | 111725439 | A | 9/2020 |
| CN | 112447925 | A * | 3/2021 |
| CN | 112447925 | A | 3/2021 |

OTHER PUBLICATIONS

Written Opinion of the International Search Authority in International application No. PCT/CN2021/089302, dated Dec. 23, 2021.

* cited by examiner

DISPLAY PANEL INCLUDING ANTI-CRACK STRUCTURE WITHIN CHAMFERED RECESS, MANUFACTURING METHOD THEREOF AND DISPLAY DEVICE

FIELD OF INVENTION

The present disclosure relates to the field of a display technology, and more particularly, to a display panel and a manufacturing method thereof, and a display device.

BACKGROUND OF INVENTION

Organic light-emitting diode (OLED) display devices are widely used because of advantages, such as self-illumination, fast response speed, and wide viewing angles. In order to improve the screen-to-body ratio of the existing OLED display devices, an o-cut (o-shaped opening) display device is designed. For the o-cut display device, an opening is formed by the substrate, so that the light-emitting layer is discontinuous in the o-cut area while the packaging layer is continuous in the o-cut area to keep the packaging integrity of the display device. However, for the existing o-cut display device, as shown in FIG. 1, since there is a chamfer formed between the substrate and the array layer, the angle between the packaging layer and the horizontal direction is about 180 degrees. The disposition of the packaging layer is too steep, so that the packaging layer tends to fracture in the chamfer, thereby leading to packaging failure.

Therefore, the existing o-cut display device has the technical problem that the packaging layer tends to fracture in the chamfer, which results in the packaging failure for the display device.

SUMMARY OF INVENTION

Technical Problems

A display panel and a manufacturing method thereof, and a display device are disclosed to solve the technical problem that the packaging layer in the existing o-cut display device tends to fracture in the chamfer.

Technical Solutions

In order to solve the aforementioned problem, the technical solutions provided by the present disclosure are as follow:

In an embodiment of the present disclosure, a display panel is provided, including a display area and an electronic component disposition area, wherein the display panel includes:
- a substrate including a recess located in the display area and the electronic component disposition area, wherein the recess includes a chamfer located in the display area;
- a driving circuit layer disposed on one side of the substrate, wherein the driving circuit layer is disposed in the display area;
- a light-emitting layer disposed on one side of the driving circuit layer away from the substrate;
- a packaging layer disposed on one side of the light-emitting layer away from the driving circuit layer;
- wherein the chamfer is defined between the driving circuit layer and the substrate, the chamfer is provided with an anti-crack structure, the anti-crack structure is in contact with the packaging layer, and the anti-crack structure is configured for reducing an angle from a contact plane of the anti-crack structure and the packaging layer to a plane in which the light-emitting layer is located.

In some embodiments, the packaging layer extends from the light-emitting layer to the recess, and the packaging layer is disposed near the chamfer.

In some embodiments, the packaging layer extends from the light-emitting layer to the recess, and the angle from the contact plane of the packaging layer and the anti-crack structure to the plane in which the light-emitting layer is located is less than or equal to 90 degrees.

In some embodiments, the anti-crack structure is disposed in the display area, the angle from the contact plane of the packaging layer and the anti-crack structure to the plane in which the light-emitting layer is located is a right angle, and the contact plane of the packaging layer and the anti-crack structure is disposed at an interface between the display area and the electronic component disposition area.

In some embodiments, the anti-crack structure extends from the display area to the electronic component disposition area, the packaging layer contacts an upper side of the anti-crack structure and a left side of the anti-crack structure, and an angle between the two sides of the anti-crack structure contacting the packaging layer is a right angle.

In some embodiments, the anti-crack structure extends from the display area to the electronic component disposition area, and the angle from the contact plane of the packaging layer and the anti-crack structure to the plane in which the light-emitting layer is located is an acute angle.

In some embodiments, a thickness of the anti-crack structure is less than or equal to a distance between a bottom of the recess and a bottom of the driving circuit layer.

In some embodiments, a material of the anti-crack structure includes an organic material, an inorganic material, and an organic material laminated layer which are doped with a liquid absorbent.

Moreover, in an embodiment of the present disclosure, a display panel manufacturing method is provided, including:
- providing a substrate;
- forming a driving circuit layer on the substrate, and etching the substrate to form a recess, wherein the recess is disposed in a display area and an electronic component disposition area, the recess includes a chamfer located in the display area, and the driving circuit layer is disposed in the display area;
- forming a light-emitting layer on the driving circuit layer, wherein the light-emitting layer includes a first light-emitting layer located on the driving circuit layer and a second light-emitting layer located in the electronic component disposition area;
- forming an anti-crack structure in the chamfer;
- forming a packaging layer on the light-emitting layer, wherein the anti-crack structure is configured for reducing an angle from a contact plane of the anti-crack structure and the packaging layer to a plane in which the light-emitting layer is located.

Moreover, in an embodiment of the present disclosure, a display device is provided, including:
- a display panel including a display area and an electronic component disposition area, wherein the display panel includes a substrate, a driving circuit layer, a light-emitting layer, and a packaging layer, wherein the substrate includes a recess located in the display area and the electronic component disposition area, and the recess includes a chamfer located in the display area; the driving circuit layer is disposed on one side of the substrate, and the driving circuit layer is disposed in the display area; the light-emitting layer is disposed on one side of the driving circuit layer away from the substrate, and the packaging layer is disposed on one side of the light-emitting layer away from the driving circuit layer; wherein the chamfer is defined between the driving circuit layer and the substrate, the chamfer is provided with an anti-crack structure, the anti-crack structure is in contact with the packaging layer, and the anti-crack structure is configured for reducing an angle from a contact plane of the anti-crack structure and the packaging layer to a plane in which the light-emitting layer is located;

an electronic component disposed in the electronic component disposition area.

In some embodiments, the electronic component includes an under-display camera.

In some embodiments, the packaging layer extends from the light-emitting layer to the recess, and the packaging layer is disposed near the chamfer.

In some embodiments, the packaging layer extends from the light-emitting layer to the recess, and the angle from the contact plane of the packaging layer and the anti-crack structure to the plane in which the light-emitting layer is located is less than or equal to 90 degrees.

In some embodiments, the anti-crack structure is disposed in the display area, the angle from the contact plane of the packaging layer and the anti-crack structure to the plane in which the light-emitting layer is located is a right angle, and the contact plane of the packaging layer and the anti-crack structure is disposed at an interface between the display area and the electronic component disposition area.

In some embodiments, the anti-crack structure extends from the display area to the electronic component disposition area, the packaging layer contacts an upper side of the anti-crack structure and a left side of the anti-crack structure, and an angle between the two sides of the anti-crack structure contacting the packaging layer is a right angle.

In some embodiments, the anti-crack structure extends from the display area to the electronic component disposition area, and the angle from the contact plane of the packaging layer and the anti-crack structure to the plane in which the light-emitting layer is located is an acute angle.

In some embodiments, the light-emitting layer includes a first portion disposed in the display area and a second portion disposed in the electronic component disposition area, and the anti-crack structure contacts a side surface of the second portion of the light-emitting layer in the electronic component disposition area.

In some embodiments, a thickness of the anti-crack structure is less than or equal to a distance between a bottom of the recess and a bottom of the driving circuit layer.

In some embodiments, a material of the anti-crack structure comprises an organic material, an inorganic material, and an organic material laminated layer which are doped with a liquid absorbent.

In some embodiments, a width of the recess is greater than 0.

Beneficial Effects:

A display panel, a manufacturing method thereof, and a display device are disclosed. The display panel includes a display area and an electronic component disposition area. The display panel includes a substrate, a driving circuit layer, a light-emitting layer, and a packaging layer. The substrate includes a recess located in the display area and the electronic component disposition area, wherein the recess includes a chamfer located in the display area. The driving circuit layer is disposed on one side of the substrate, wherein the driving circuit layer is disposed in the display area. The light-emitting layer is disposed on one side of the driving circuit layer away from the substrate. The packaging layer is disposed on one side of the light-emitting layer away from the driving circuit layer. The chamfer is defined between the driving circuit layer and the substrate, the chamfer is provided with an anti-crack structure, the anti-crack structure is in contact with the packaging layer, and the anti-crack structure is configured for reducing an angle from a contact plane of the anti-crack structure and the packaging layer to a plane in which the light-emitting layer is located. The present disclosure provides the anti-crack structure that is disposed in the chamfer between the driving circuit layer and the substrate. The anti-crack structure is in contact with the packaging layer to reduce the angle from the contact plane of the anti-crack structure and the packaging layer to the plane in which a light-emitting layer is located, so that the packaging layer is smoothly disposed, the risk of the fracture of the packaging layer is lowered, and the failure of the display panel is avoided.

DESCRIPTION OF DRAWINGS

The technical solutions and other beneficial effects of the present disclosure may be obvious through the detailed description of the specific embodiments of the present disclosure with reference made to the accompanying drawings as follows.

DETAILED DESCRIPTION OF PREFERRED EMBODIMENTS

The technical solutions in the embodiments of the present disclosure are hereinafter described clearly and in detail with reference to the accompanying drawings. Obviously, the described embodiments are only some embodiments rather than all embodiments of the present disclosure. All the other embodiments which could be obtained by those skilled in the art based on the embodiments of the present disclosure and without creative effort, shall all fall within the scope of protection of the present disclosure.

Figure 1:
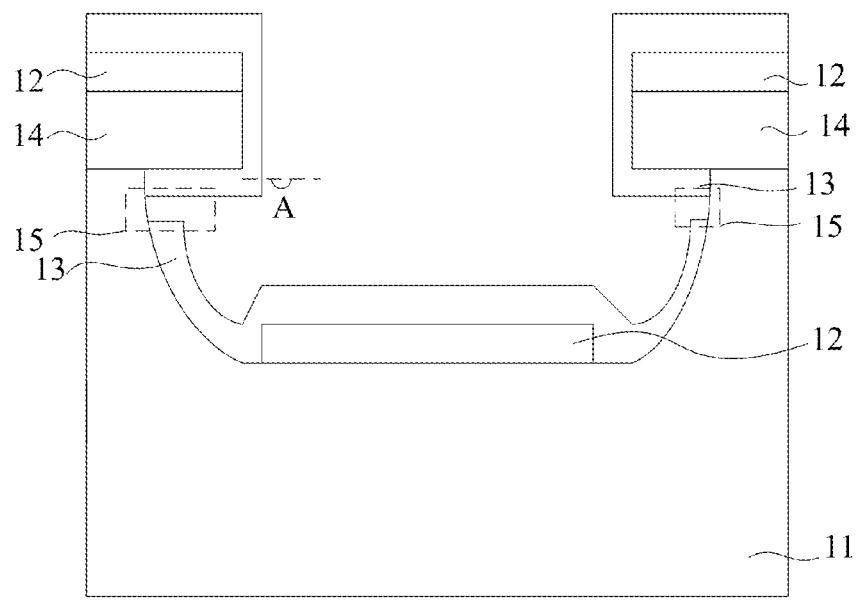
FIG. 1 is a schematic diagram of the existing display device with the o-cut design.

As shown in FIG. 1, for the existing display device with the o-cut design, a chamfer is formed between a substrate 11 and an array layer 14. After a light-emitting layer 12 is formed on the array layer 14, a whole layer of packaging layer 13 is disposed in order to block the invasion of water and oxygen. However, during the disposition of the packaging layer 13, since the angle A of the packaging layer 13 at the chamfer (i.e., the angle between the packaging layer in the chamfer and the horizontal direction) is near 180 degrees, the packaging layer 13 in the chamfer is too steep.

For the packaging layer 13, stress concentrates at the chamfer, and the packaging layer 13 tends to fracture. As shown in FIG. 1, the packaging layer 13 has a fracture 15 in the chamfer, resulting in packaging failure. Therefore, the existing display device with the o-cut design has the technical problem that the packaging layer tends to fracture in the chamfer, leading to the packaging failure for the display device.

For the aforementioned technical problems, a display panel, a manufacturing method thereof, and a display device are disclosed in embodiments of the present disclosure for solving the aforementioned technical problems.

Figure 2:
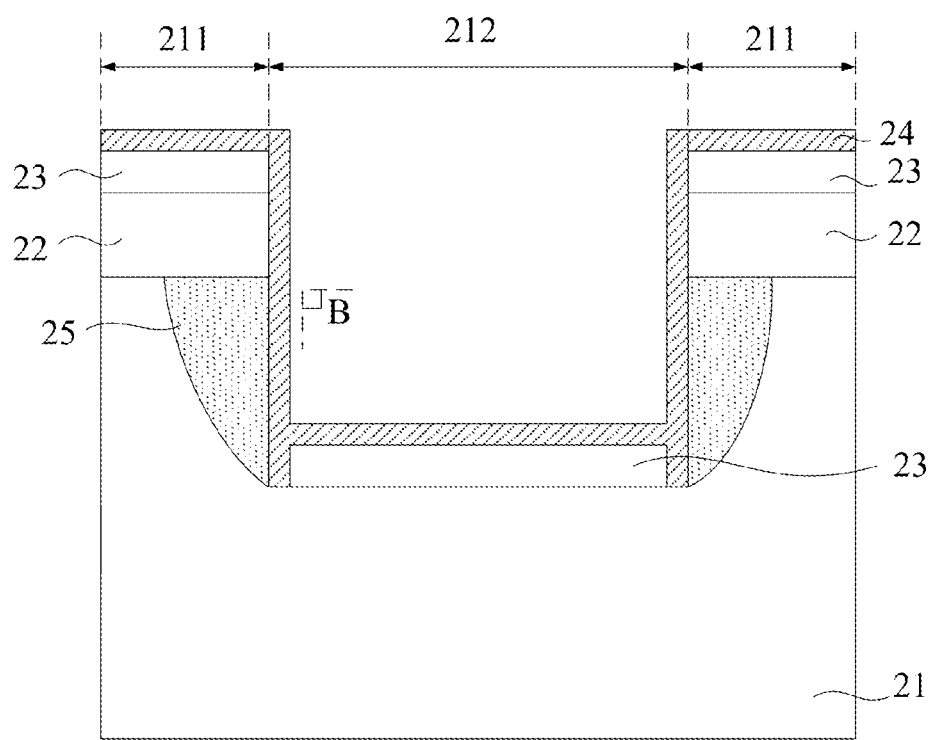
FIG. 2 is a first schematic diagram of a display panel provided by embodiments of the present disclosure.
Figure 6:
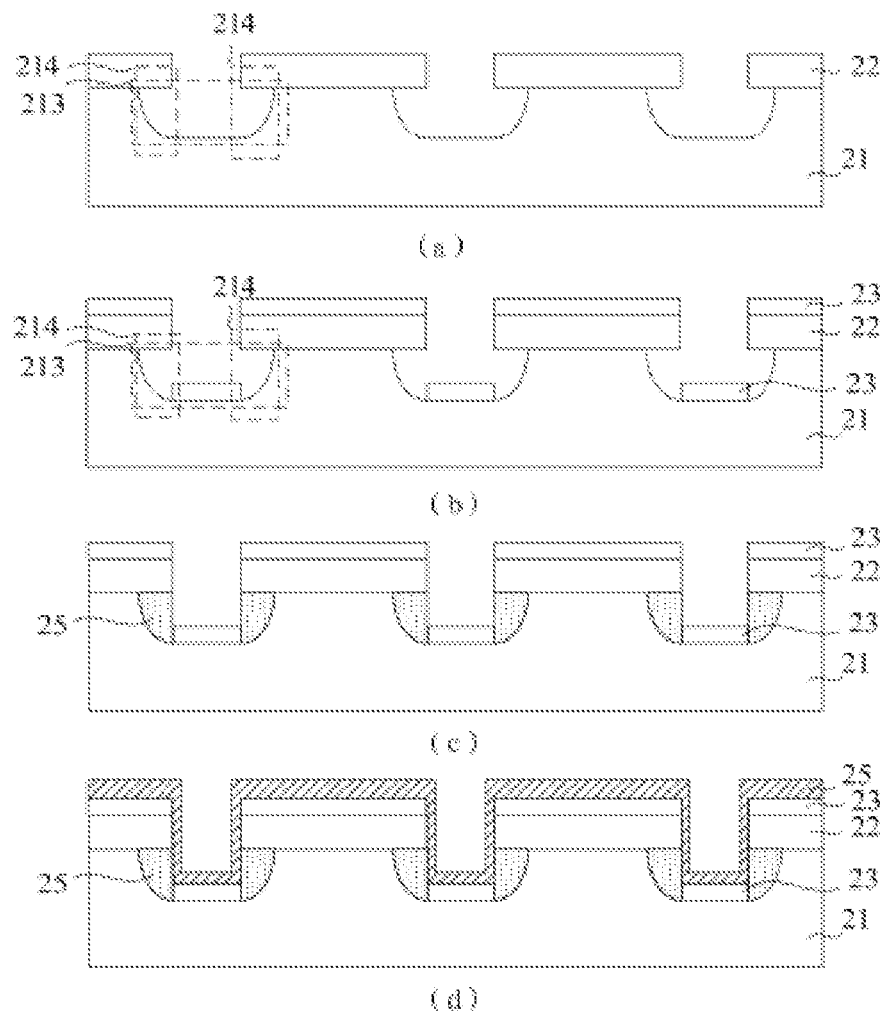
FIG. 6 is a structural diagram of a display panel corresponding to each step of a display panel manufacturing method provided by embodiments of the present disclosure.

As shown in FIG. 2 and FIG. 6, a display panel is disclosed in embodiments of the present disclosure, which includes a display area 211 and an electronic component disposition area 212. The display panel includes the following components:

A substrate 21 includes a recess 213 located in the display area 211 and the electronic component disposition area 212, wherein the recess 213 includes a chamfer 214 located in the display area 211.

A driving circuit layer 22 is disposed on one side of the substrate 21, wherein the driving circuit layer 22 is disposed in the display area 211.

A light-emitting layer 23 is disposed on one side of the driving circuit layer 22 away from the substrate 21.

A packaging layer 24 is disposed on one side of the light-emitting layer 23 away from the driving circuit layer 22.

The chamfer 214 is defined between the driving circuit layer 22 and the substrate 21, and the chamfer 214 is provided with an anti-crack structure 25. The anti-crack structure 25 is in contact with the packaging layer 24, and the anti-crack structure 25 is configured for reducing an angle from a contact plane of the anti-crack structure 25 and the packaging layer 24 to a plane in which the light-emitting layer 23 located.

A display panel is provided in embodiments of the present disclosure. For the display panel, the anti-crack structure is disposed in the chamfer between the driving circuit layer and the substrate. The anti-crack structure is in contact with the packaging layer to reduce an angle from the contact plane of the anti-crack structure and the packaging layer to the plane in which the light-emitting layer is located, so that the packaging layer is smoothly disposed, the risk of the fracture of the packaging layer is lowered, and the failure of the display panel is avoided.

In regard to the problem that the angle of the packaging layer in the chamfer in the display panel is steep, which leads to the fracture of the packaging layer in the chamfer, in one embodiment, the packaging layer extends from the light-emitting layer to the recess, and the packaging layer is disposed near the chamfer. The packaging layer is disposed near the chamfer and is supported by the anti-crack structure in the chamfer, so that the angle of the packaging layer in the chamfer is reduced, thereby smoothing the angle of the packaging layer in the chamfer and lowering the risk of the fracture of the packaging layer. Since the packaging layer is disposed near the chamfer, the angle of the packaging layer is obtuse at this time. However, because of the filling of the anti-crack structure, the disposed angle of the packaging layer is smoothed, which can reduce the risk of the fracture of the packaging layer.

When the packaging layer is disposed near the chamfer, the disposed angle of the packaging layer is still steep, and the risks of the fracture and failure of the packaging layer are high. In one embodiment, the packaging layer extends from the light-emitting layer to the recess, and the angle from the contact plane of the packaging layer and the anti-crack structure to the plane in which the light-emitting layer is located is less than or equal to 90 degrees. By disposing the packaging layer outside the chamfer, the packaging layer is avoided being extended along the opposite direction in the chamfer, which results in the disposed angle of the packaging layer being too steep. By making the angle from the contact plane of the packaging layer and the anti-crack structure to the plane in which the light-emitting layer is located being less than or equal to 90 degrees, the packaging layer extends forward in the recess of the substrate without extending along the opposite direction, so that the disposed angle of the packaging layer is smoothed, thereby reducing the risk of the fracture of the packaging layer.

In one embodiment, the angle from the contact plane of the packaging layer and the anti-crack structure to the plane in which the light-emitting layer is located is greater than 0 degree. In order to avoid that the anti-crack structure is disposed in the whole recess of the substrate, which causes the anti-crack structure to affect the light transmittance of the electronic component disposition area, and to reduce the risk of the fracture of the packaging layer, the angle from the contact plane of the packaging layer and the anti-crack structure to the plane in which the light-emitting layer is located is greater than 0 degree, which enables the disposed angle of the packaging layer to be smoothed, and the anti-crack structure does not affect the light transmittance of the electronic component disposition area in the display panel.

In one embodiment, as shown in FIG. 2, the anti-crack structure 25 is disposed in the display area 211, the angle B from the contact plane of the packaging layer 24 and the anti-crack structure 25 to the plane in which the light-emitting layer 23 is located is a right angle, and the contact plane of the packaging layer 24 and the anti-crack structure 25 is disposed at the interface between the display area 211 and the electronic component disposition area 212. When disposing the anti-crack structure, the anti-crack structure can be disposed in the display area. By filling the chamfer with the anti-crack structure, the packaging layer can be disposed outside the chamfer, so that the disposed angle of the packaging layer is smoothed, and the anti-crack structure fails to be disposed in the electronic component disposition area, which prevents the anti-crack structure from affecting the light transmittance of the electronic component disposition area.

The disposition of the anti-crack structure in the display area is described in detail in the aforementioned embodiments. In one embodiment, the anti-crack structure may be made of a light-shielding material. Since the anti-crack structure is disposed under the light-emitting layer in the display area, the light emission of the display panel is not affected. By disposing the anti-crack structure under the light-emitting layer, the light leaked down from the light-emitting layer may be prevented from emitting to the electronic components, which influences the daylighting performance of the electronic components.

The anti-crack structure made of the light-shielding material is described in detail in the aforementioned embodiment. In order to further improve the daylighting performance in the electronic component disposition area, in one embodiment, the anti-crack structure is made of a reflective material. By the anti-crack structure made of the reflective material, the light reflects downward instead of being absorbed by the anti-crack structure or other film layers of the display panel when the light illuminates on the side of the anti-crack structure, thereby improving the daylighting performance of the electronic components.

In one embodiment, the anti-crack structure extends from the display area to the electronic component disposition area, the packaging layer contacts the upper side of the anti-crack structure and the left side of the anti-crack structure, and the angle between the two sides of the anti-crack structure contacting the packaging layer is a right angle. By making the anti-crack structure form a right angle in the electronic component disposition area, the packaging layer is directly disposed on the anti-crack structure. The anti-crack structure supports the packaging layer and the angle between the two sides of the anti-crack structure contacting the packaging layer is a right angle, the angle of the packaging layer is further smoothed. The drop of the packaging layer is lowered to further reduce the risk of the fracture of the packaging layer.

Figure 3:
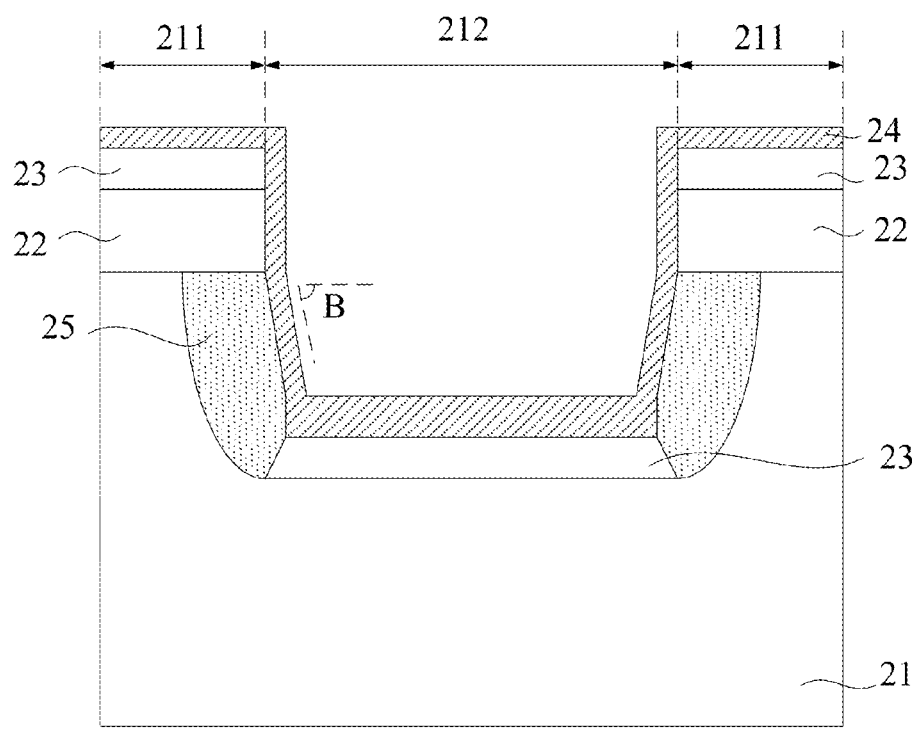
FIG. 3 is a second schematic diagram of a display panel provided by embodiments of the present disclosure.

In one embodiment, as shown in FIG. 3, the anti-crack structure 25 extends from the display area 211 to the electronic component disposition area 212, and the angle from the contact plane of the packaging layer 24 and the anti-crack structure 25 to the plane in which the light-emitting layer 23 is located is an acute angle. By extending the anti-crack structure from the display area to the electronic component disposition area to dispose the packaging layer on the anti-crack structure, the disposed angle of the packaging layer becomes the acute angle, which further reduces the steepness of the packaging layer to smooth the packaging layer, thereby reducing the risk of the fracture of the packaging layer.

In one embodiment, the light-emitting layer includes a first portion disposed in the display area and a second portion disposed in the electronic component disposition area, and the anti-crack structure contacts the side surface of the second portion of the light-emitting layer in the electronic component disposition area. When disposing the anti-crack structure, the anti-crack structure can contact the second portion of the light-emitting layer in the electronic component disposition area, so that the anti-crack structure and the light-emitting layer enable the packaging layer to form a flat plane, which prevents the packaging layer from being located in the bending position, thereby reducing the risk of the fracture of the packaging layer.

Figure 4:
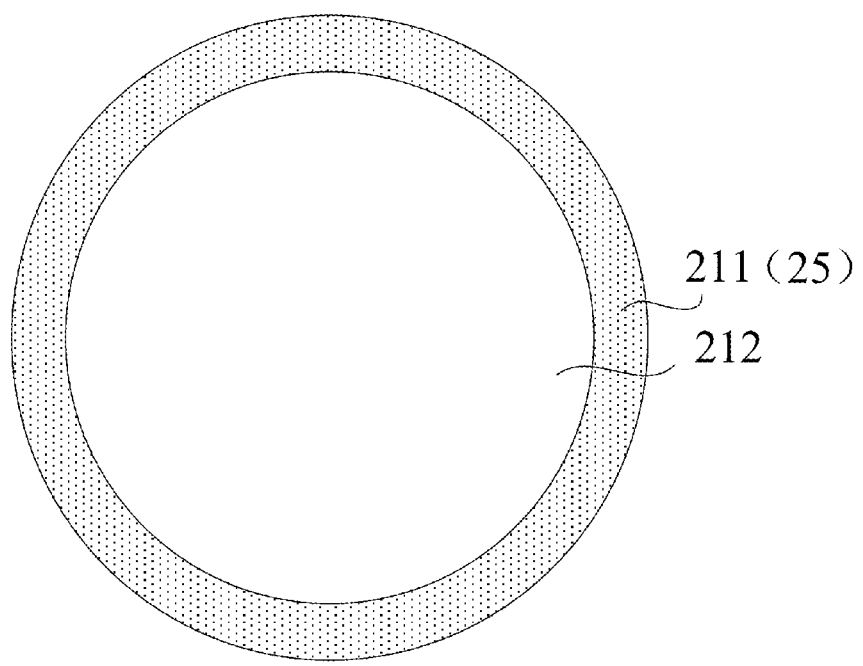
FIG. 4 is a third schematic diagram of a display panel provided by embodiments of the present disclosure.

The disposition position of the anti-crack structure is described in detail in the aforementioned embodiment. During the disposition of the anti-crack structure, the anti-crack structure is disposed according to the shape of the electronic component disposition area. In one embodiment, as shown in FIG. 4, when the electronic component disposition area is o-cut-shaped, the anti-crack structure 25 is disposed in the display area 211 and around the electronic component disposition area 212, which enables the anti-crack structure to reduce the disposed angle of the packaging layer, thereby lowering the risk of the fracture of the packaging layer. However, the embodiment of the present application is not limited thereto. When the electronic component disposition area has other shapes, the anti-crack structure may be disposed around the electronic component disposition area correspondingly, so as to reduce the risk of the fracture of the packaging layer.

In one embodiment, the thickness of the anti-crack structure is less than or equal to the distance between the bottom of the recess and the bottom of the driving circuit layer. When disposing the anti-crack structure, the anti-crack structure can support the packaging layer to smooth the disposed angle of the packaging layer, so as to reduce the risk of the fracture of the packaging layer. The chamfer may be filled with the anti-crack structure or have a certain gap, and the embodiment of the present disclosure is not limited thererto.

When the anti-crack structure is disposed in the chamfer, the ability to block water and oxygen may be influenced for the display panel. In one embodiment, the material of the anti-crack structure includes an organic material, an inorganic material, and an organic material laminated layer, which are doped with a liquid absorbent. By selecting the material with water-blocking performance as the material of the anti-crack structure, the anti-crack structure can block water and oxygen. The anti-crack structure includes the organic material, so as to avoid the strong rigidity of the anti-crack structure, which affects the flexibility of the display panel.

In one embodiment, the minimum width of the recess is greater than 0.

In one embodiment, the driving circuit layer includes a buffer layer, an active layer, a first gate insulation layer, a first metal layer, a second gate insulation layer, a second metal layer, an interlayer insulation layer, a source/drain layer, a planarization layer, and a pixel electrode layer, which are disposed in order.

In one embodiment, the light-emitting layer includes a light-emitting material layer, a pixel definition layer, and a common electrode layer.

In one embodiment, the packaging layer includes a first inorganic layer, an organic layer, and a second inorganic layer.

In one embodiment, the display panel includes an OLED display panel and a liquid crystal display panel.

Figure 5:
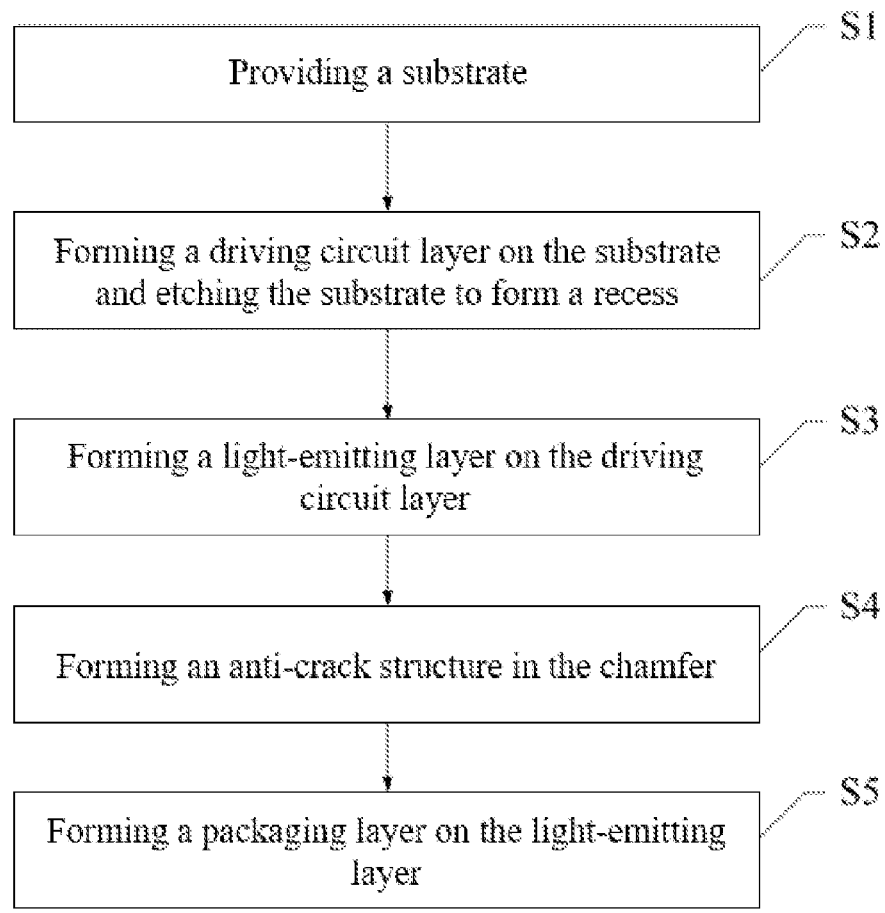
FIG. 5 is a flow chart of a display panel manufacturing method provided by embodiments of the present disclosure.

As shown in FIG. 5, a method for manufacturing a display panel is disclosed in an embodiment of the present disclosure, which includes the following steps.

S1: a substrate is provided. The structure of the display panel is shown in FIG. 6(a).

S2: a driving circuit layer is formed on the substrate and the substrate is etched to form a recess. The recess is disposed in the display area and the electronic component disposition area. The recess includes a chamfer located in the display area, and the driving circuit layer is disposed in the display area. The structure of the display panel is shown in FIG. 6(a).

S3: a light-emitting layer is formed on the driving circuit layer. The light-emitting layer includes a first light-emitting layer on the driving circuit layer and a second light-emitting layer in the electronic element disposition area. The structure of the display panel is shown in FIG. 6(b).

S4: an anti-crack structure is formed in the chamfer. The structure of the display panel is shown in FIG. 6(c).

S5: a packaging layer is formed on the light-emitting layer. The anti-crack structure is configured to reduce the angle from the contact plane of the anti-crack structure and the packaging layer to the plane in which the light-emitting layer is located. The structure of the display panel is shown in FIG. 6(d).

A method for manufacturing a display device is disclosed in the embodiment of the present disclosure. In the method for manufacturing the display device, the anti-crack structure is formed in the chamfer between the driving circuit layer and the substrate before the packaging layer is formed, so that the anti-crack structure is in contact with the packaging layer, thereby reducing the angle from the contact plane of the anti-crack structure and the packaging layer to the plane in which the light-emitting layer is located by the anti-crack structure, which enables the packaging layer to be smoothly disposed, reduces the risk of the fracture of the packaging layer and avoids the failure of the display panel.

In one embodiment, when the anti-crack structure is formed, the organic material doped with the liquid absorbent can be printed into the chamfer by ink-jet printing.

Figure 7:
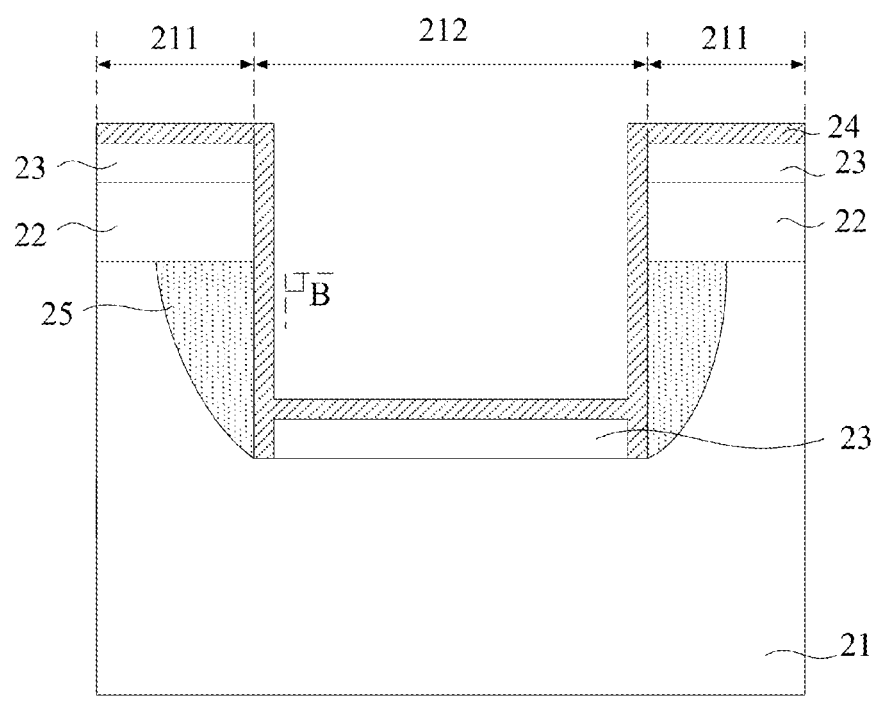
FIG. 7 is a schematic diagram of a display device provided by embodiments of the present disclosure.
Figure 7:

As shown in FIG. 6 and FIG. 7, a display device is disclosed in an embodiment of the present disclosure, which includes a display panel and an electronic component 31.

The display panel includes a display area 211 and an electronic component disposition area 212. The display panel includes a substrate 21, a drive circuit layer 22, a light-emitting layer 23, and a packaging layer 24. The substrate 21 includes a recess 213 located in the display area 211 and the electronic component disposition area 212, and the recess 213 includes a chamfer 214 located in the display area 211. The driving circuit layer 22 is disposed on one side of the substrate 21, and the driving circuit layer 22 is disposed in the display area 211. The light-emitting layer 23 is disposed on one side of the driving circuit layer 22 away from the substrate 21. The packaging layer 24 is disposed on one side of the light-emitting layer 23 away from the driving circuit layer 22. The chamfer 214 is defined between the driving circuit layer 22 and the substrate 21, wherein the chamfering 214 is provided with an anti-crack structure 25, and the anti-crack structure 25 contacts the packaging layer 24. The anti-crack structure 25 is configured to reduce the angle B from the contact plane of the anti-crack structure 25 and the packaging layer 24 to the plane where the light-emitting layer 23 is located.

The electronic element 31 is disposed in the electronic component disposition area 212.

A display device is disclosed in the embodiment of the present disclosure, which includes the display panel and the electronic component. By disposing the anti-crack structure in the chamfer between the driving circuit layer and the substrate, the anti-crack structure contacts the packaging layer, so the anti-crack structure can reduce the angle from the contact plane of the anti-crack structure and the packaging layer to the plane where the light-emitting layer is located, thereby enabling the packaging layer to be smoothly disposed, reducing the risk of the fracture of the packaging layer and avoiding the failure of the display panel.

In some embodiments, the electronic component includes an under-display camera.

In some embodiments, in the display device, the packaging layer extends from the light-emitting layer to the recess, and the packaging layer is disposed near the chamfer.

In some embodiments, in the display device, the packaging layer extends from the light-emitting layer to the recess, and the angle from the contact plane of the packaging layer and the anti-crack structure to the plane in which the light-emitting layer is located is less than or equal to 90 degrees.

In some embodiments, in the display device, the anti-crack structure is disposed in the display area, the angle from the contact plane of the packaging layer and the anti-crack structure to the plane in which the light-emitting layer is located is a right angle, and the contact plane of the packaging layer and the anti-crack structure is disposed at the interface between the display area and the electronic component disposition area.

In some embodiments, in the display device, the anti-crack structure extends from the display area to the electronic component disposition area, the packaging layer contacts the upper side and left side of the anti-crack structure, and the angle between the two sides of the anti-crack structure contacting the packaging layer is a right angle.

In some embodiments, in the display device, the anti-crack structure extends from the display area to the electronic component disposition area, and the angle from the contact plane of the packaging layer and the anti-crack structure to the plane in which the light-emitting layer is located is an acute angle.

In some embodiments, the light-emitting layer includes a first portion disposed in the display area and a second portion disposed in the electronic component disposition area, and the anti-crack structure contacts the side surface of the second portion of the light-emitting layer in the electronic component disposition area.

In some embodiments, in the display device, the thickness of the anti-crack structure is less than or equal to the distance between the bottom of the recess and the bottom of the driving circuit layer.

In some embodiments, in the display device, the material of the anti-crack structure includes an organic material, an inorganic material, and an organic material laminated layer which are doped with the liquid absorbent.

In some embodiments, the width of the recess is greater than 0.

According to the aforementioned embodiments, the following can be seen.

A display panel, a manufacturing method thereof, and a display device are disclosed in the embodiments of the present disclosure. The display panel includes the display area and the electronic component disposition area. The display panel includes the substrate, the driving circuit layer, the light-emitting layer, and the packaging layer. The substrate includes the recess located in the display area and the electronic component disposition area, and the recess includes the chamfer located in the display area. The driving circuit layer is disposed on one side of the substrate, and the driving circuit layer is disposed in the display area. The light-emitting layer is disposed on one side of the driving circuit layer away from the substrate. The packaging layer is disposed on one side of the light-emitting layer away from the driving circuit layer. The chamfer is defined between the driving circuit layer and the substrate, and the chamfer is provided with the anti-crack structure. The anti-crack structure is in contact with the packaging layer, and the anti-crack structure is configured for reducing the angle from the contact plane of the anti-crack structure and the packaging layer to the plane in which the light-emitting layer is located. The present disclosure provides the anti-crack structure that is disposed in the chamfer between the driving circuit layer and the substrate. The anti-crack structure is in contact with the packaging layer to reduce the angle from the contact plane of the anti-crack structure and the packaging layer to the plane in which a light-emitting layer is located, so that the packaging layer is smoothly disposed, the risk of the fracture of the packaging layer is lowered, and the failure of the display panel is avoided.

In the aforementioned embodiments, the description of each embodiment has its emphasis. The part not detailed in one embodiment may refer to the related description of other embodiments.

A display panel, a manufacturing method thereof, and a display device provided in the embodiments of the present disclosure are described in detail. The specification describes the principles and the implementations of the present disclosure using specific examples. The descriptions of the foregoing embodiments are merely used to help understanding of the methods and core concepts of the present disclosure. One of ordinary skill in the art should understand that modifications may be made to the technical solutions disclosed in aforementioned embodiments or substitutions may be made for some technical features therein, and these modifications or substitutions shall not make the spirit of the corresponding technical solutions depart from scope of the technical solutions in the embodiments of the present disclosure.

What is claimed is:

1. A display panel comprising a display area and an electronic component disposition area, wherein the display panel comprises:
   a substrate comprising a recess located in the display area and the electronic component disposition area, wherein the recess comprises a chamfer located in the display area;
   a driving circuit layer disposed on one side of the substrate, wherein the driving circuit layer is disposed in the display area;
   a light-emitting layer disposed on one side of the driving circuit layer away from the substrate;
   a packaging layer disposed on one side of the light-emitting layer away from the driving circuit layer;
   wherein the chamfer is defined between the driving circuit layer and the substrate, the chamfer is provided with an anti-crack structure, the anti-crack structure is in contact with the packaging layer, and the anti-crack structure is configured for reducing an angle from a contact plane of the anti-crack structure and the packaging layer to a plane in which the light-emitting layer is located, wherein the contact angle is less than 90 degrees, and wherein the packaging layer contacts the side surfaces of the driving circuit layer and the light emitting layer.

2. The display panel according to claim 1, wherein the packaging layer extends from the light-emitting layer to the recess, and the packaging layer is disposed near the chamfer.

3. The display panel according to claim 1, wherein the packaging layer extends from the light-emitting layer to the recess, and the angle from the contact plane of the packaging layer and the anti-crack structure to the plane in which the light-emitting layer is located is less than or equal to 90 degrees.

4. The display panel according to claim 3, wherein the anti-crack structure is disposed in the display area, the angle from the contact plane of the packaging layer and the anti-crack structure to the plane in which the light-emitting layer is located is a right angle, and the contact plane of the packaging layer and the anti-crack structure is disposed at an interface between the display area and the electronic component disposition area.

5. The display panel according to claim 3, wherein the anti-crack structure extends from the display area to the electronic component disposition area, and the angle from the contact plane of the packaging layer and the anti-crack structure to the plane in which the light-emitting layer is located is an acute angle.

6. The display panel according to claim 5, wherein a thickness of the anti-crack structure is less than or equal to a distance between a bottom of the recess and a bottom of the driving circuit layer.

7. The display panel according to claim 5, wherein a material of the anti-crack structure comprises an organic material, an inorganic material, and an organic material laminated layer which are doped with a liquid absorbent.

8. A display panel manufacturing method, comprising:
   providing a substrate;
   forming a driving circuit layer on the substrate, and etching the substrate to form a recess, wherein the recess is disposed in a display area and an electronic component disposition area, the recess comprises a chamfer located in the display area, and the driving circuit layer is disposed in the display area;
   forming a light-emitting layer on the driving circuit layer, wherein the light-emitting layer comprises a first light-emitting layer located on the driving circuit layer and a second light-emitting layer located in the electronic component disposition area;
   forming an anti-crack structure in the chamfer;
   forming a packaging layer on the light-emitting layer, wherein the anti-crack structure is configured for reducing an angle from a contact plane of the anti-crack structure and the packaging layer to a plane in which the light-emitting layer is located, wherein the contact angle is less than 90 degrees, and wherein the packaging layer contacts the side surfaces of the driving circuit layer and the light emitting layer.

9. A display device, comprising:
   a display panel comprising a display area and an electronic component disposition area, wherein the display panel comprises a substrate, a driving circuit layer, a light-emitting layer, and a packaging layer, wherein the substrate comprises a recess located in the display area and the electronic component disposition area, and the recess comprises a chamfer located in the display area; the driving circuit layer is disposed on one side of the substrate, and the driving circuit layer is disposed in the display area; the light-emitting layer is disposed on one side of the driving circuit layer away from the substrate, and the packaging layer is disposed on one side of the light-emitting layer away from the driving circuit layer; wherein the chamfer is defined between the driving circuit layer and the substrate, the chamfer is provided with an anti-crack structure, the anti-crack structure is in contact with the packaging layer, and the anti-crack structure is configured for reducing an angle from a contact plane of the anti-crack structure and the packaging layer to a plane in which the light-emitting layer is located;
   an electronic component disposed in the electronic component disposition area.

10. The display device according to claim 9, wherein the electronic component comprises an under-display camera.

11. The display device according to claim 9, wherein the packaging layer extends from the light-emitting layer to the recess, and the packaging layer is disposed in the chamfer.

12. The display device according to claim 9, wherein the packaging layer extends from the light-emitting layer to the recess, and the angle from the contact plane of the packaging layer and the anti-crack structure to the plane in which the light-emitting layer is located is less than or equal to 90 degrees.

13. The display device according to claim 12, wherein the anti-crack structure is disposed in the display area, the angle from the contact plane of the packaging layer and the anti-crack structure to the plane in which the light-emitting layer is located is a right angle, and the contact plane of the packaging layer and the anti-crack structure is disposed at an interface between the display area and the electronic component disposition area.

14. The display device according to claim 12, wherein the anti-crack structure extends from the display area to the electronic component disposition area, and the angle from the contact plane of the packaging layer and the anti-crack structure to the plane in which the light-emitting layer is located is an acute angle, wherein the contact angle is less than 90 degrees, and wherein the packaging layer contacts the side surfaces of the driving circuit layer and the light emitting layer.

15. The display device according to claim 14, wherein the light-emitting layer comprises a first portion disposed in the display area and a second portion disposed in the electronic component disposition area, and the anti-crack structure contacts a side surface of the second portion of the light-emitting layer in the electronic component disposition area.

16. The display device according to claim 14, wherein a thickness of the anti-crack structure is less than or equal to a distance between a bottom of the recess and a bottom of the driving circuit layer.

17. The display device according to claim 14, wherein a material of the anti-crack structure comprises an organic material, an inorganic material, and an organic material laminated layer which are doped with a liquid absorbent.

18. The display device according to claim 9, wherein a width of the recess is greater than 0.

* * * * *